United States Patent [19]
Lambson et al.

[11] Patent Number: 5,933,314
[45] Date of Patent: Aug. 3, 1999

[54] METHOD AND AN APPARATUS FOR OFFSETTING PLASMA BIAS VOLTAGE IN BI-POLAR ELECTRO-STATIC CHUCKS

[75] Inventors: Albert M. Lambson, Fremont; Rick Caple, Newark; Eric H. Lenz, San Jose; Laura M. Braun, Fremont; Ricky Marsh, San Ramon, all of Calif.

[73] Assignee: LAM Research Corp., Fremont, Calif.

[21] Appl. No.: 08/883,068

[22] Filed: Jun. 27, 1997

[51] Int. Cl.⁶ .................................................. H02N 13/00
[52] U.S. Cl. ........................... 361/234; 361/235; 279/128
[58] Field of Search ................... 361/233–235; 279/128

[56] References Cited

U.S. PATENT DOCUMENTS

| | | | |
|---|---|---|---|
| 5,103,367 | 4/1992 | Horwitz et al. | |
| 5,557,215 | 9/1996 | Saeki et al. | 324/765 |
| 5,699,223 | 12/1997 | Mashiro et al. | 361/234 |
| 5,708,250 | 1/1998 | Benjamin et al. | 361/234 |
| 5,737,175 | 4/1998 | Grosshart et al. | 361/234 |

FOREIGN PATENT DOCUMENTS

| | | |
|---|---|---|
| 0 615 281 A1 | 9/1994 | European Pat. Off. |
| 2 293 689 | 4/1996 | United Kingdom. |

*Primary Examiner*—Fritz Fleming
*Attorney, Agent, or Firm*—Beyer & Weaver, LLP Inc.

[57] ABSTRACT

A control circuit configured to control a reference voltage of a reference node of an electrostatic chuck power supply is disclosed. The electrostatic chuck power supply is configured to clamp a substrate to a bipolar electrostatic chuck. The electrostatic chuck has a first buried conductor and a second buried conductor. The electrostatic chuck power supply has a first output configured for being coupled with the first buried plate. The first output has a first output voltage referenced to the reference voltage of the reference node. The electrostatic chuck power supply also has a second output configured for being coupled with the second buried plate. The first output has a first output voltage referenced to the reference voltage of the reference node. The control circuit includes: a first resistor coupled in series with the first output; a first amplifier coupled to the first resistor for sensing a voltage drop across the first resistor; a second resistor in series with said second output; and a second amplifier coupled to the second resistor for sensing a voltage drop across the second resistor.

17 Claims, 6 Drawing Sheets

PLASMA PRESENT
FIG. 6

METHOD AND AN APPARATUS FOR OFFSETTING PLASMA BIAS VOLTAGE IN BI-POLAR ELECTRO-STATIC CHUCKS

BACKGROUND OF THE INVENTION

The present invention relates to semiconductor devices and apparatus for their manufacture. More particularly, the present invention relates to improved apparatus and methods for clamping a semiconductor substrate on a bipolar electrostatic chuck in a plasma processing chamber.

Figure 1:
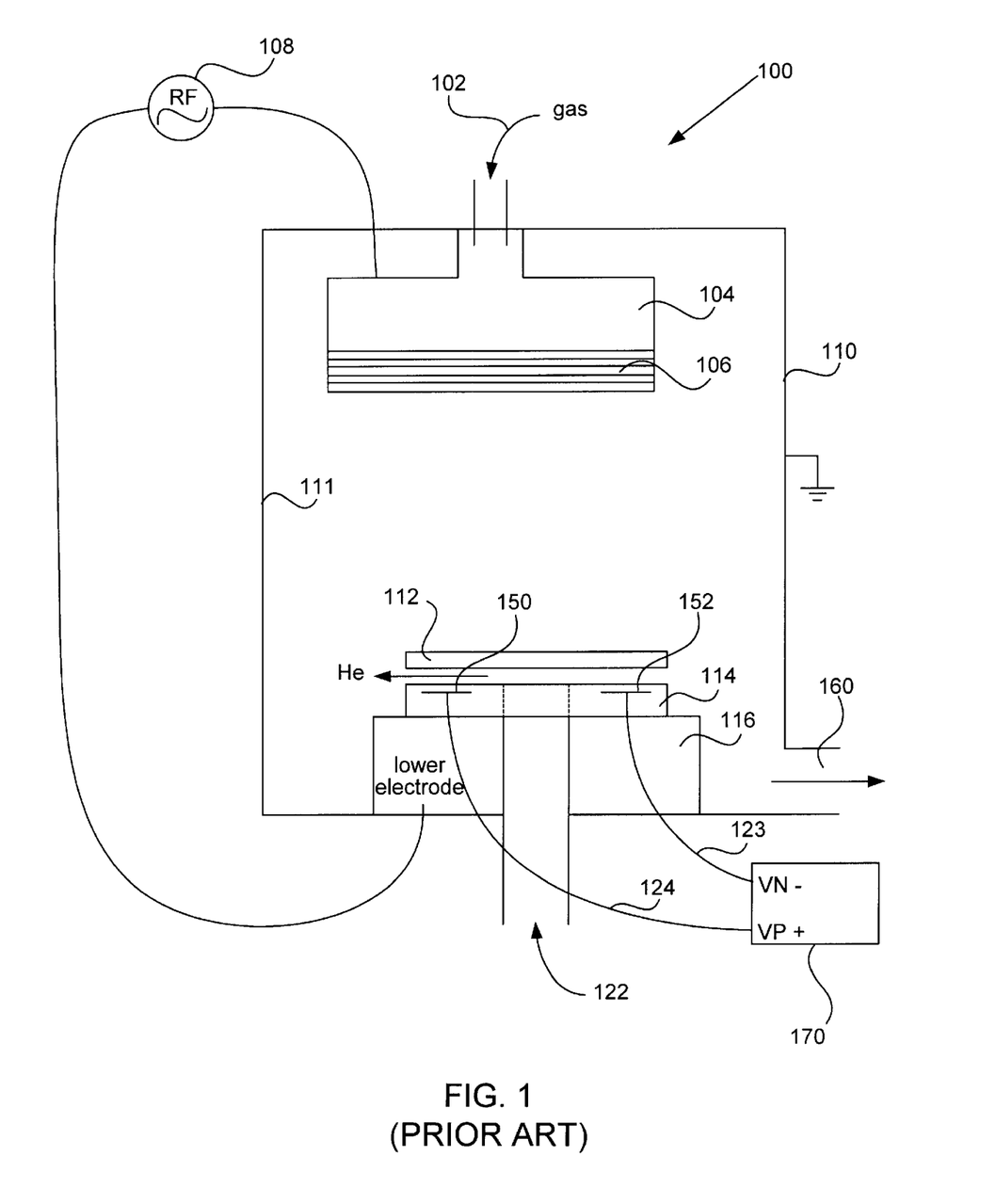
FIG. 1 illustrates, to facilitate discussion, a typical plasma substrate processing system.

The use of bipolar electrostatic chucks in plasma processing systems is well known. To facilitate discussion of the foregoing, FIG. 1 illustrates a simplified schematic of a substrate processing chamber which represents a chamber suitable for use with a bipolar electrostatic chuck. Referring to FIG. 1, a substrate plasma processing system 100 includes a plasma processing chamber 110. Within chamber 110, there is disposed an electrode 104 which may represent a showerhead-type or TCP coil is energized by a RF generator 108.

Within the top portion of chamber 110 and extending into the top portion of electrode 104, there is provided a gas orifice 102 into which gaseous source materials (e.g., the etchant source gases) are directed. In this embodiment, showerhead-type electrode 104 preferably includes a plurality of baffles 106 for diffusing gaseous source materials into the RF-induced plasma region 134 above a substrate 112, representing for example a semiconductor substrate or a flat panel display. The gaseous source materials may also be released from ports built into the walls of the chamber itself or from a gas ring apparatus disposed below the substrate.

Substrate 112 is introduced into chamber 110 and disposed on a bipolar electrostatic chuck 114. Bipolar electrostatic chuck 114 is integrally attached and electrically connected to a lower electrode 116. Bipolar electrostatic chuck 114 and lower electrode 116 are therefore typically at the same RF potential. Lower electrode 116 typically receives RF power from RF generator 108. A power supply 170 provides a negative bias voltage $V_N$ by way of a lead 123 to a first buried plate 152 as well as a positive bias $V_P$ by way of a lead 124 to a second buried plate 150.

To protect power supply 170 from the RF energy supplied by RF generator 108, RF filters (conventional and omitted from FIG. 1 to simplify the illustration) may be disposed between power supply 170 and RF generator 108. Analogously, dc blocking capacitors (conventional and omitted from FIG. 1 to simplify the illustration) may also be disposed between power supply 170 and RF generator 108 to prevent RF generator 108 from being affected by the dc potential levels supplied by power supply 170.

A coolant port 122 extends through both lower electrode 116 and electrostatic chuck 114. Helium cooling gas is introduced under pressure (e.g., about 5–10 Torr in one embodiment) via coolant orifice 122. The helium cooling gas impinges a lower surface of substrate 112 to act as a heat transfer medium for accurately controlling the substrate's temperature during processing to ensure uniform and repeatable process results. During plasma processing, the pressure within chamber 110 is preferably kept low by withdrawing gas through a port 160, e.g., between about 5 to 25 mTorr in one embodiment. A plurality of heaters (omitted from FIG. 1 to simplify the illustration) may be provided to maintain a suitable chamber temperature for etching (e.g., about 70° C. in one embodiment). To provide an electrical path to ground, the wall 111 of chamber 110 may be typically grounded.

Figure 2A:
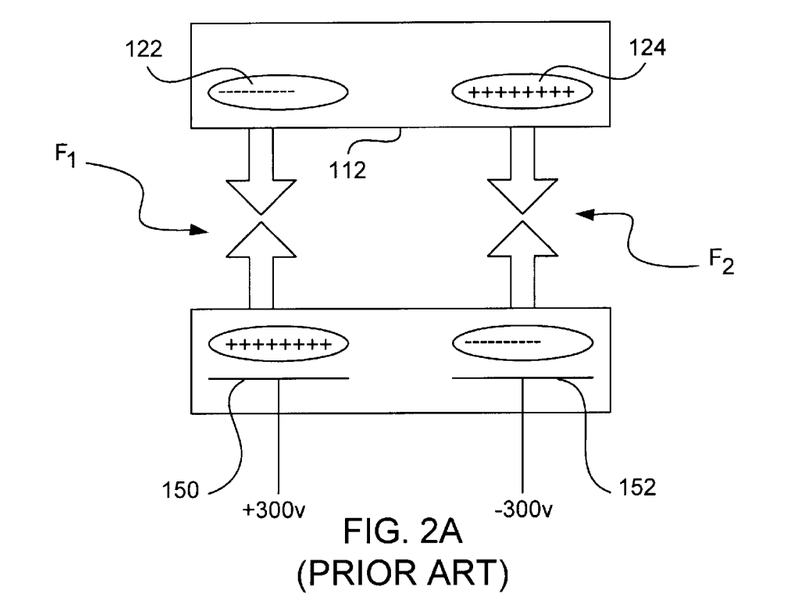
FIG. 2A is a cross-sectional illustration of a bipolar electrostatic chuck and substrate showing the distribution of induced electrical charges and resulting clamping forces.

FIG. 2A illustrates in greater detail a cross-section of bipolar electrostatic chuck 114 of FIG. 1. As the name implies, bipolar electrostatic chuck 114 has two buried plates: a negatively charged buried plate 152 and a positively charged buried plate 150. The buried plates of bipolar electrostatic chuck 114 are coupled to power supply 170 of FIG. 1. When power supply 170 is turned on, buried plate 150 is positively biased by power supply 170 relative to the common reference potential level. Power supply 170 also biases buried plate 152 negatively relative to the common reference potential level. Since the buried plates 150 and 152 are in fixed locations, the electrostatic fields created by the charged buried plates are well defined in the region surrounding each buried plate.

For an p-type semiconductor wafer, holes in substrate 112 migrate toward a region of substrate immediately overlying negatively biased buried plate 152. A region of net positive charge is thereby formed equal in field strength but opposite in polarity to the field created in electrostatic chuck 114 by buried plate 152. A resulting region of net negative charge is formed in substrate 112 in the area immediately overlying the positively biased buried plate 150. In the same manner, for an n-type semiconductor wafer, electrons in substrate 112 migrate toward the region of substrate 112 immediately overlying positive buried plate 150. A region of net negative charge is thereby formed equal in field strength but opposite in polarity to the field created in electrostatic chuck 114 by buried plate 150. A resulting region of net positive charge is formed in substrate 112 in the region immediately overlying the negatively biased buried plate 152.

As is known to those skilled in the art, the presence of the oppositely charged regions in substrate 112 and the biased plates 150 and 152 in electrostatic chuck 114 results in induced electrostatic forces coupling substrate 112 and electrostatic chuck 114. By way of example, FIG. 2A shows an electrostatic force $F_1$ between positively charged plate 150 and the negatively charged region 122 of substrate 112. FIG. 2A also shows an electrostatic force $F_2$ between negatively charged plate 152 and positively charged region 124 of substrate 112. As is known in the art, the strength of force $F_1$ is directly proportional to the potential difference between biased plate 150 and charged region 122. In a similar manner, the strength of force $F_2$ is directly proportional to the potential difference between biased plate 152 and charged region 124. In this example, electrostatic forces $F_1$ and $F_2$ act to clamp substrate 112 to electrostatic chuck 114.

Typically, it is desirable to have balanced clamping forces (i.e., electrostatic force $F_1$ and electrostatic force $F_2$ are substantially equal in strength) applied to a workpiece, or substrate, during the plasma operation.

Figure 2B:
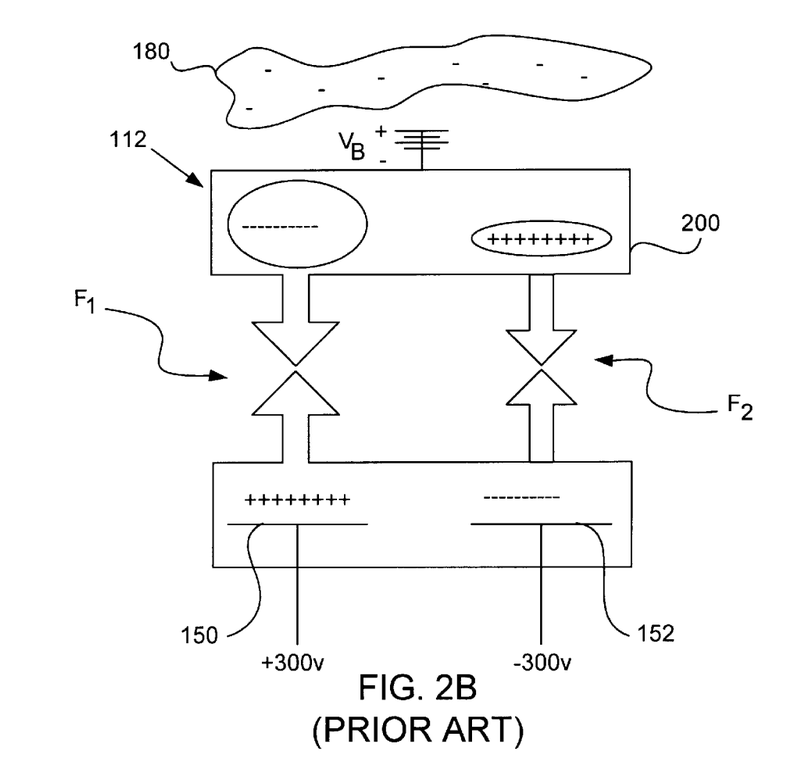
FIG. 2B is a cross-sectional illustration of a bipolar electrostatic chuck and substrate as illustrated in FIG. 2A showing the effect of a negatively charged plasma on the distribution of induced electrical charges and resulting unbalanced clamping forces.

However, subsequent to the introduction of a negatively charged plasma into chamber 110, substrate 112 becomes negatively biased with reference to the electrostatic chuck by plasma induced bias $-V_B$. By way of example, FIG. 2B is an illustration of the effect of a negatively charged plasma 180 on the electrostatic clamping forces F1 and F2. The plasma induced bias $-V_B$ in substrate 112 offsets the relative voltage potential drops between the induced charge regions 122 and 124 in substrate 112 and biased buried plates 150 and 152 (which are held at a fixed potential relative to a common ground by power supply 170). Since electrostatic forces $F_1$ and $F_2$ are directly proportional to the relative potential differences between regions 122 and 124 and plates 150 and 152, the plasma induced bias $-V_B$ will unbalance clamping forces $F_1$ and $F_2$ by increasing force $F_1$ and decreasing force $F_2$.

To illustrate this condition, consider the case where power supply 170 biases positive pole 204 at +350 V and negative pole 206 at −350 V relative to the common reference voltage level. With the plasma off, the substrate potential is at 0 V relative to the common reference voltage level, and the potential differences between the poles of bipolar chuck 114 and their overlying substrate regions are +350 V and −350 V respectively.

When substrate 112 is negatively charged due to the presence of plasma, however, the potential differences between the substrate and the two poles of the bipolar electrostatic chuck may become asymmetric. For example, the substrate bias voltage may be −100 V when the plasma is turned on. In this case, the potential difference between the positive pole and the negatively biased substrate is increased to +450 V, i.e., (+350 V- (−100 V)). However, the potential difference between the negative pole and the negatively biased substrate is decreased to only −250 V, i.e., (−350 V- (−100 V)). The reduction in the potential difference reduces the electrostatic holding forces between the negative pole and the wafer. Consequently, some heat-exchange gas may escape, resulting in inadequate temperature control and/or process variations. In some cases, the electrostatic force holding the substrate to the bipolar chuck may become so weak that it is insufficient to resist the force exerted on the substrate by the pressure differential between the helium cooling pressure and the low pressure within the chamber, resulting in the substrate "popping off" the chuck's surface.

Further, the plasma-induced negative substrate bias may unduly increase the potential difference between the negatively-biased substrate and the positive pole of the bipolar chuck. An excessively high potential difference may cause arcing ( i.e., sparking) between the lower surface of the substrate and the upper surface of the chuck or excessive current into or out of the plasma, resulting in pit mark damage. Over time, the surface of the chuck may be damaged to the point where it becomes impossible to keep the heat-exchange gas properly sealed.

Figure 3:
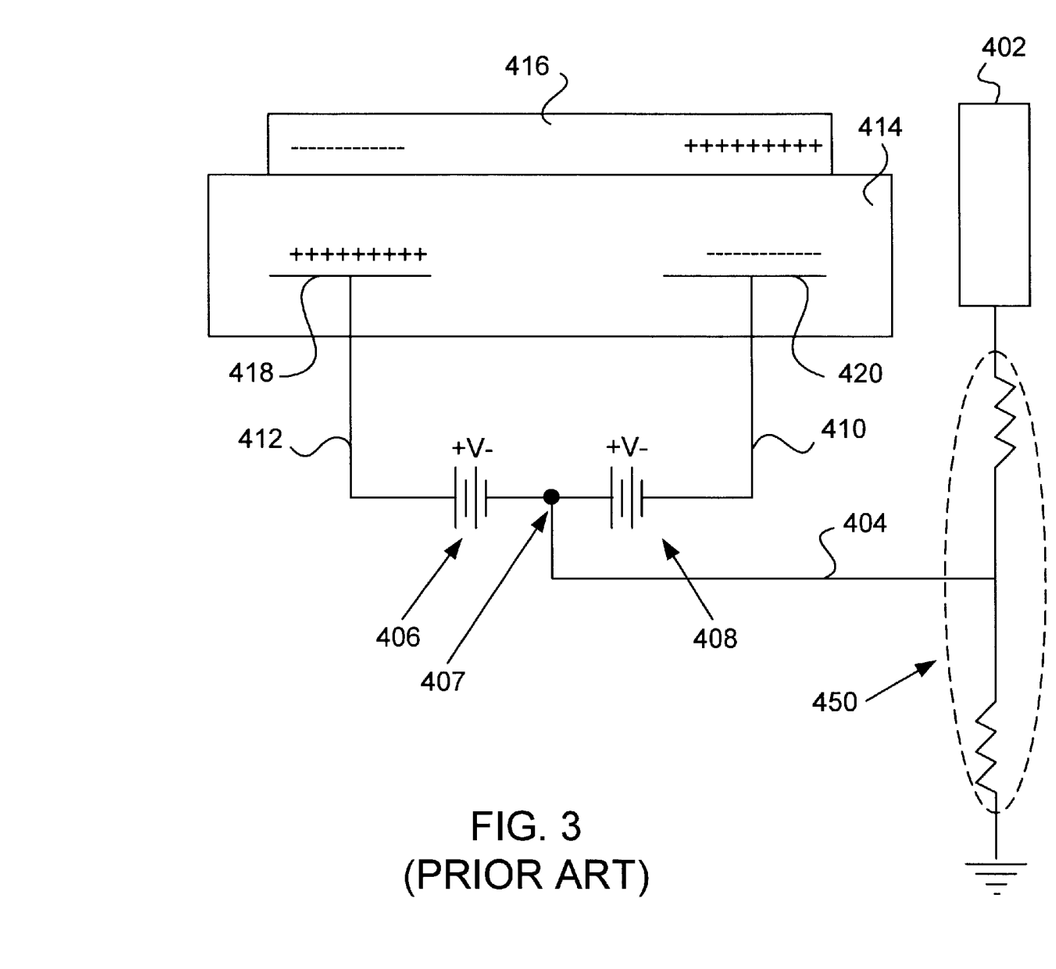
FIG. 3 illustrates a prior art circuit based on use of a pick up pin designed to compensate for plasma induced bias in a wafer.

A prior art attempt to compensate the plasma induced bias is illustrated in FIG. 3. The electrostatic chuck 414 includes a negatively biased buried plate 420 and a positively biased plate 418. A DC power supply 406 and a DC power supply 408 supply the necessary voltage potential with respect to a variable ground reference node 407 to plates 418 and 420, respectively, to create regions of opposite and equal charges in substrate 416. These regions of opposite and approximately equal charges create the required clamping forces. A pickup pin 402 is disposed inside the chamber to sense the plasma induced bias created in wafer 416 and, in this manner, provide the input necessary to vary reference node 407. Varying ground reference node 407 has the effect of compensating for the induced plasma bias by appropriately increasing and decreasing the applied potentials to plates 418 and 420.

However, the use of pick up pin 402 has many disadvantages. One such disadvantage is the fact that the pick up pin 402 is only approximating the plasma induce bias in substrate 416. Unfortunately, this approximation may be affected by many factors not under the control of the user. By way of example, pick up pin 402 will, overtime, undergo plasma induced damage known in the art as sputtering in which the energetic plasma ions cause particles of the pick up pin to dislodge and contaminate the plasma within the chamber. In addition to introducing unwanted contamination, this damage will alter the electrical characteristics of the pick up pin in a manner which requires routine calibration and adjustment (i.e., presence of resistor bridge 450 to compensate for variation in electrical characteristics of pick up pin 402) as well as eventual replacement resulting in significant downtime and lost production.

Pick up pin 402 may not be able to adequately compensate for the plasma induced bias in substrate 416 if the plasma in the region where it is located is significantly different than that impinging on the surface of substrate 416. This difference in plasma between that seen by pick up pin 402 and wafer 416 may be due to such factors as: spatial variations ( i.e., radial distribution of plasma density/temperature), non-uniformities in the plasma itself due to irregular geometries, for example. In practice, any one of these factors may render use of pick up pin 402 as a mechanism for compensating for the plasma induced bias less than satisfactory.

In view of the foregoing, there are desired improved techniques for improved clamping of the substrate to the bipolar electrostatic chuck, particularly in the presence of plasma. To lower cost, and/or reduce contamination, the improved techniques preferably do not require the use of a pick-up pin, and/or a second power supply or complicated control circuitries.

SUMMARY OF THE INVENTION

The present invention relates, in one embodiment, to a control circuit configured to control a reference voltage of a reference node of an electrostatic chuck power supply. The electrostatic chuck power supply is configured to clamp a substrate to a bipolar electrostatic chuck. The electrostatic chuck has a first buried conductor and a second buried conductor. The electrostatic chuck power supply has a first output configured for being coupled with the first buried conductor. The first output has a first output voltage referenced to the reference voltage of the reference node. The electrostatic chuck power supply also has a second output configured for being coupled with the second buried conductor. The second output has a second output voltage referenced to the reference voltage of the reference node.

The control circuit includes: a first resistor coupled in series with the first output; a first amplifier coupled to the first resistor for sensing a first voltage drop across the first resistor; a second resistor in series with said second output; and a second amplifier coupled to the second resistor for sensing a second voltage drop across the second resistor.

In another embodiment, a power supply configured for coupling with a bipolar electrostatic chuck having a first buried conductor and a second buried conductor is disclosed. The power supply includes a reference node and a first output configured for being coupled with the first buried conductor such that the first output has a first output voltage referenced to the reference node. The power supply also includes a second output configured for being coupled with the second buried conductor, the second output having a second output voltage referenced to the reference node. The power supply further includes a control circuit coupled to the first output and the second output. The control circuit senses a current difference between a first current of the first output and a second current of the second output. The control circuit outputs a control voltage on a control output of the control circuit to control a potential level on the reference node. The control voltage is substantially proportional to the current difference.

In yet another embodiment, a method for clamping a substrate to a chuck in a plasma processing center is disclosed. The method includes the following operative steps. Providing a chuck having a first buried conductor and a second buried conductor. Next, providing a first power supply having a reference node. In this embodiment, the first power supply has a first output and a second output such that the first buried conductor is coupled to the first output and the second buried conductor is coupled to the second output. The first power supply further includes a control circuit coupled to the first output and the second output to sense a current difference between a first current of the first output and a second current of the second output. The control circuit operates to output a control voltage on a control output of the control circuit to control a potential level on the reference node. The control voltage is substantially proportional to the current difference.

In still another embodiment, a control circuit configured to control a reference voltage of a reference node of an electrostatic chuck power supply is disclosed. The electrostatic chuck power supply is configured to clamp a substrate to a bipolar electrostatic chuck which has a first buried conductor and a second buried conductor. The electrostatic chuck power supply has a first output configured for being coupled with the first buried conductor. The first output has a first output voltage referenced to the reference voltage of the reference node. The electrostatic chuck power supply also has a second output configured for being coupled with the second buried conductor. The second output has a second output voltage referenced to the reference voltage of the reference node. The control circuit includes a first resistive means coupled in series with the first output. A first sensing means is coupled to the first resistive means for sensing a first voltage drop across said first resistive means. The control circuit further includes a second resistive means in series with the second output as well as a second sensing means. The second sensing means is coupled to the second resistive means for sensing a second voltage drop across the second resistive means.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The invention relates to using a self biasing power supply to compensate for plasma induced bias voltages in a bipolar electrostatic chuck within a plasma processing chamber. In one embodiment of the invention, the power supply utilizes the leakage current properties of the electrostatic chuck to measure the amount of bias voltage applied during the plasma process. The bias voltage offsets the leakage current flow between the positive and negative leads of the power supply. It is this offset that forms the input to a feedback loop which ultimately has the effect of offsetting the ground reference which compensates for the plasma induced bias voltage.

Figure 4:
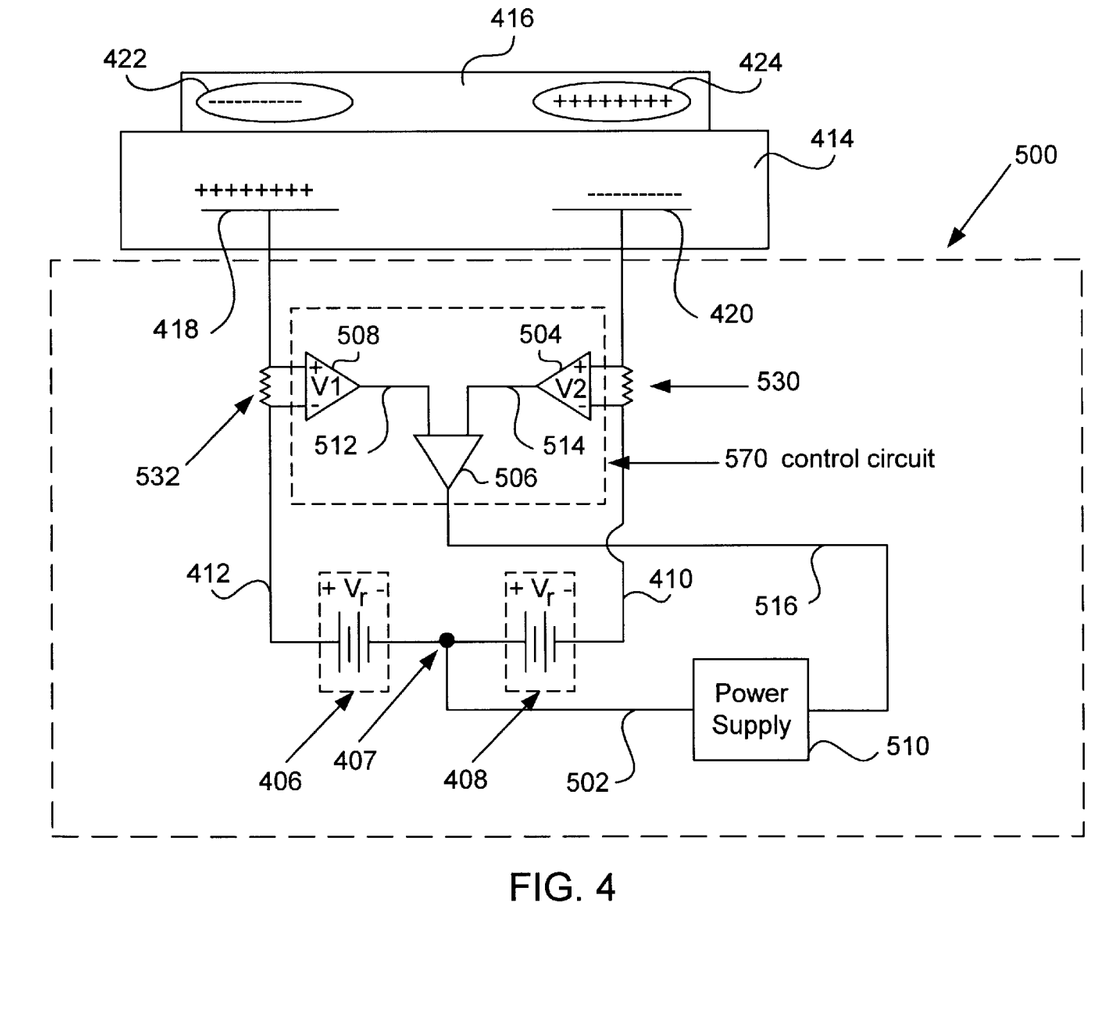
FIG. 4 illustrates, in accordance with one embodiment of the present invention, a self biasing electrostatic chuck power supply for supplying plasma induced bias compensating voltages to the plates of a bipolar electrostatic chuck.

FIG. 4 illustrates, in accordance with one embodiment of the present invention, self biasing electrostatic chuck power supply 500 for supplying unbalanced voltages to the plates of a bipolar electrostatic chuck, e.g., chuck 414 of FIG. 4. In the configuration of FIG. 4, self biasing electrostatic chuck power supply 500 includes a variable voltage power source 510. Variable voltage power source 510 receives as its input a control signal 516 (for example, a DC signal between 0 V and 5 V), and outputs at its output terminals 502 a positive or negative ground reference node 407. In the present example, variable voltage power source 510 represents an American High Voltage, Inc. of El Cajon, Calif. TC5 voltage power source although any other conventional power source may also be employed (whether or not variable).

Output terminal 502 of variable voltage power source 510 is coupled to the anode of a DC power supply 406 and the cathode of a DC power supply 408 by way of ground reference node 407. The cathode of DC power supply 406 is coupled to buried plate 418 of electrostatic chuck 414 by way of a first leg 412 of self biasing electrostatic chuck power supply 500. In this embodiment, a resistor 532 is connected in series with buried plate 418 and the cathode of DC power supply 406. Preferably, resistor 532 is connected in parallel to the inputs nodes of an isolation amplifier 508 whereby a voltage drop $V_1$ across resistor 532 defines an input for isolation amplifier 508.

In the embodiment of FIG. 4, an anode of DC power supply 408 is coupled to buried plate 420 of electrostatic chuck 414 by way of a second leg 410 of self biasing electrostatic chuck power supply 500. In this embodiment, a resistor 530 is connected in series with buried plate 420 and the anode of DC power supply 408. Preferably, resistor 530 is connected in parallel to the inputs nodes of an isolation amplifier 504 whereby a voltage drop $V_2$ across resistor 530 forms an input for isolation amplifier 504.

In the present example, isolation amplifier 504 and isolation amplifier 508 represents an AD202KY Isolation Amplifier manufactured by Analog Devices of Santa Clara, Calif. although any other conventional isolation amplifier may also be employed (whether or not variable). Resistor 530 and resistor 532 may have a resistive value, in one example, of about 500 kΩ±1%.

According to the described embodiment, an output node 512 of isolation amplifier 508 and an output node 514 of isolation amplifier 504 each form one of a pair of inputs to a differential amplifier 506. Differential amplifier 506 has an output signal 516 which forms the input control signal for variable power supply 510. In this manner, a control circuit 570 is formed which includes isolation amplifiers 504 and 508 as well as differential amplifier 506. In the present example, differential amplifier 506 represents an OP490GP differential amplifier manufactured by Analog Devices of Santa Clara, Calif. although any other conventional differential amplifier may also be employed.

In the described embodiment, resistors 530 and 532 may be fixed, variable, or any combination of resistive elements. A variable resistors affords the user of the ability to compensate for any inherent imbalance in control circuit 570 and/or adjust for system calibration and/or operationally induced changes (e.g. electrical characteristics of electrostatic chuck 414 or of the chamber).

Figure 5:
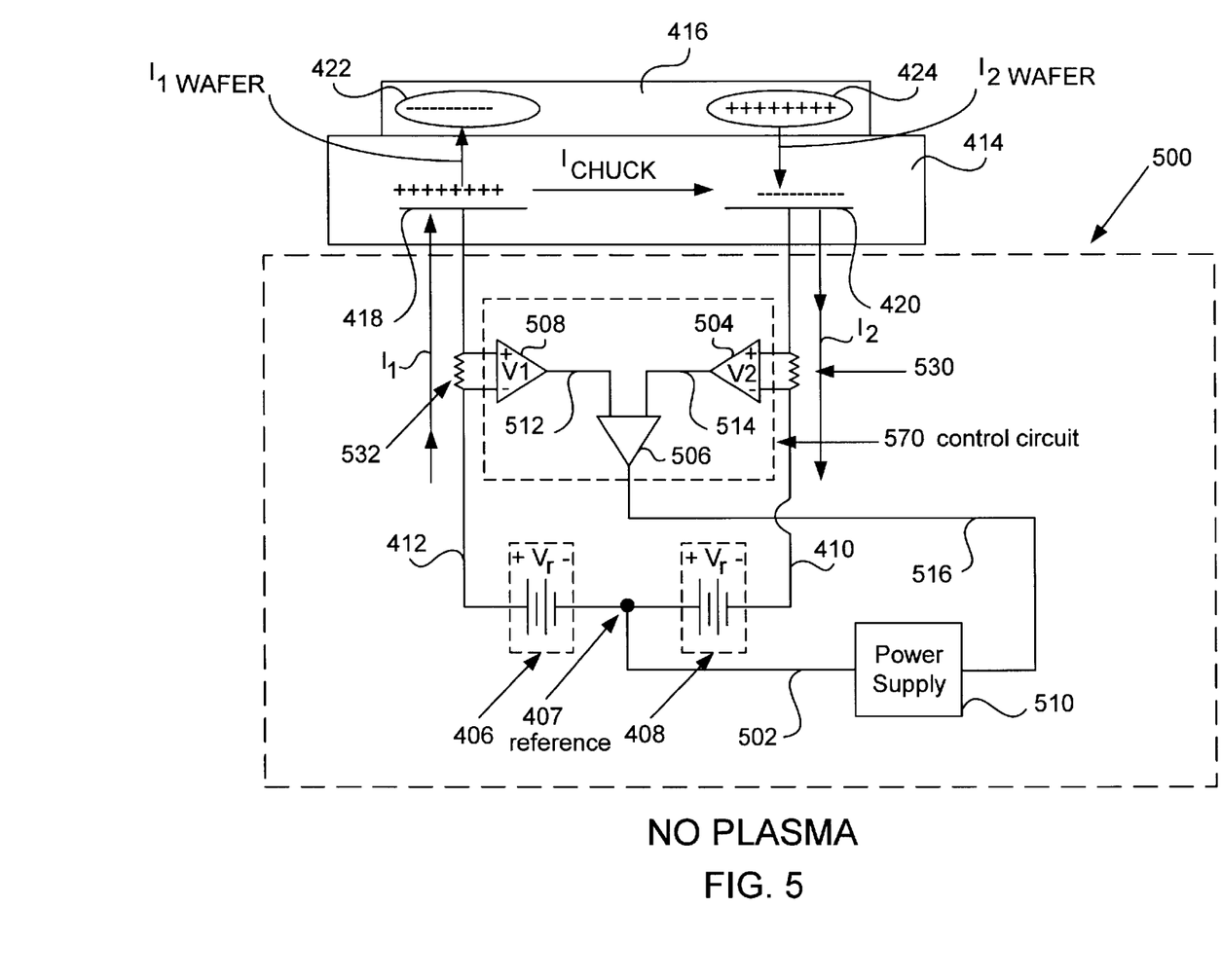
FIG. 5 illustrates the leakage currents present in substrate clamped upon an electrostatic chuck when no plasma is present in accordance with one embodiment of the present invention.

In the described embodiment, electrostatic chuck 414 may be formed of resistive materials. By way of example, materials having resistivities in the range of $10^6$–$10^{18}$ Ω-cm but more preferably a range of $10^8$–$10^{14}$ Ω-cm with a preferred range of $10^{10}$–$10^{11}$ Ω-cm are suitable. Substrate 416 may take the form of n or p-type semiconductor material having resistivity in the range of 10–40 Ω-cm. As is known in the art, when a resistive material is exposed to a potential difference, a current will flow. The current will flow from the region of higher potential to lower potential according to Ohm's Law, I=V/R, where I represents the current flow, V is the potential difference (or voltage drop) across a resistance R. With reference to FIG. 5, the resistance R, in this representation, may be a discrete element such as a resistor or group of resistors. In another embodiment, R may be a distributed element such as the region between buried plates 418 and 420. By way of example, when buried plates 418 and 420 are biased to $+V_R$ and $-V_R$ with respect to reference node 407, respectively, the potential difference, $2V_R$, will cause a leakage current $I_{CHUCK}$ to flow from plate 418 to plate 420. The leakage current $I_{CHUCK}$ substantially depends upon the difference between the applied biases on plates 418 and 420.

In operation, a workpiece, as represented by a semiconductor wafer 416, is disposed upon electrostatic chuck 414 prior to the introduction of a plasma in plasma chamber 110. In order to fixedly attach wafer 416 to electrostatic chuck 414, DC power supply 406 may bias buried plate 418 to $+V_R$ volts with respect to reference node 407. Concurrently, DC power supply 408 may also bias buried plate 420 to $-V_R$ volts with respect to reference node 407. As described above, an electric field of equal strength and opposite polarity is induced in a region 422 of wafer 416 by biased buried plate 418. In a similar manner, an electric field of equal strength and opposite polarity is induced in a region 424 of wafer 416 by biased buried plate 420. In the described embodiment, the presence of regions 422 and 424, each with substantially equal net charges, results in balanced electrostatic forces without plasma to clamp wafer 416 to electrostatic chuck 414.

FIG. 5 also illustrates the leakage currents present between the substrate clamped and electrostatic chuck. As shown, a leakage current, $I_{1WAFER}$ flows from buried plate 418 to region 422 of wafer 416 and a return current $I_{2WAFER}$ flows from region 424 of wafer 416 to buried plate 420.

As is known to those skilled in the art, currents $I_1$, $I_2$, $I_{CHUCK}$, $I_{1WAFER}$, and $I_{2WAFER}$ are related by Kirchoff's Law as:

$$I_1 = I_{CHUCK} + I_{1WAFER} \text{ and;}$$

$$I_2 = I_{CHUCK} + I_{2WAFER}.$$

In this embodiment, since plate 418 is coupled to first leg 412 of electrostatic chuck power supply 500, a first current $I_1$ (equaling the sum of $I_{CHUCK}$ and $I_{1WAFER}$, as above) will flow through resistor 532. In a similar manner, since plate 420 is coupled to second leg 410 of power supply 500, a second current $I_2$ (equaling $I_{CHUCK}$ and $I_{2WAFER}$, as above) will flow through resistor 530.

In the absence of plasma, there is no net bias induced in wafer 416. Accordingly, $I_{1WAFER}$ is equal to $I_{2WAFER}$ (current into wafer 416 equals current out of wafer 416). As described above, $I_1$ is equal to $I_2$ resulting in a voltage $V_1$ generated by $I_1$ across resistor 532 and a voltage $V_2$ generated by $I_2$ across resistor 530 being substantially equal. Since voltages $V_1$ and $V_2$ define inputs to isolation amps 508 and 504, respectively, the outputs 512 and 514 of isolation amplifiers 508 and 504 will be substantially equal. As described above, differential amplifier 506 operates on the difference between voltages $V_1$ and $V_2$ (and thus the difference between $I_1$ and $I_2$) to produce the output/control signal 516 which defines the input control signal for variable power supply 510. If voltages $V_1$ and $V_2$ ( and by analogy, $I_1$ and $I_2$) are substantially equal, then output/control signal 516 is substantially 0 V. When output/control signal 516 is substantially 0 V, variable power supply 510 does not produce a bias voltage to offset reference node 407. Thus, in the situation with no plasma present, the control circuit 570 is in its initial quiescent state.

In another embodiment, a different initial equilibrium state may be established due to intrinsic imbalances in the circuitry which result in an initial difference in leakage currents $I_1$ and $I_2$ even with no plasma present. In this embodiment, an offset voltage generated by power supply 510 may bias reference node 407 to eliminate the initial difference in leakage currents $I_1$ and $I_2$.

Figure 6:
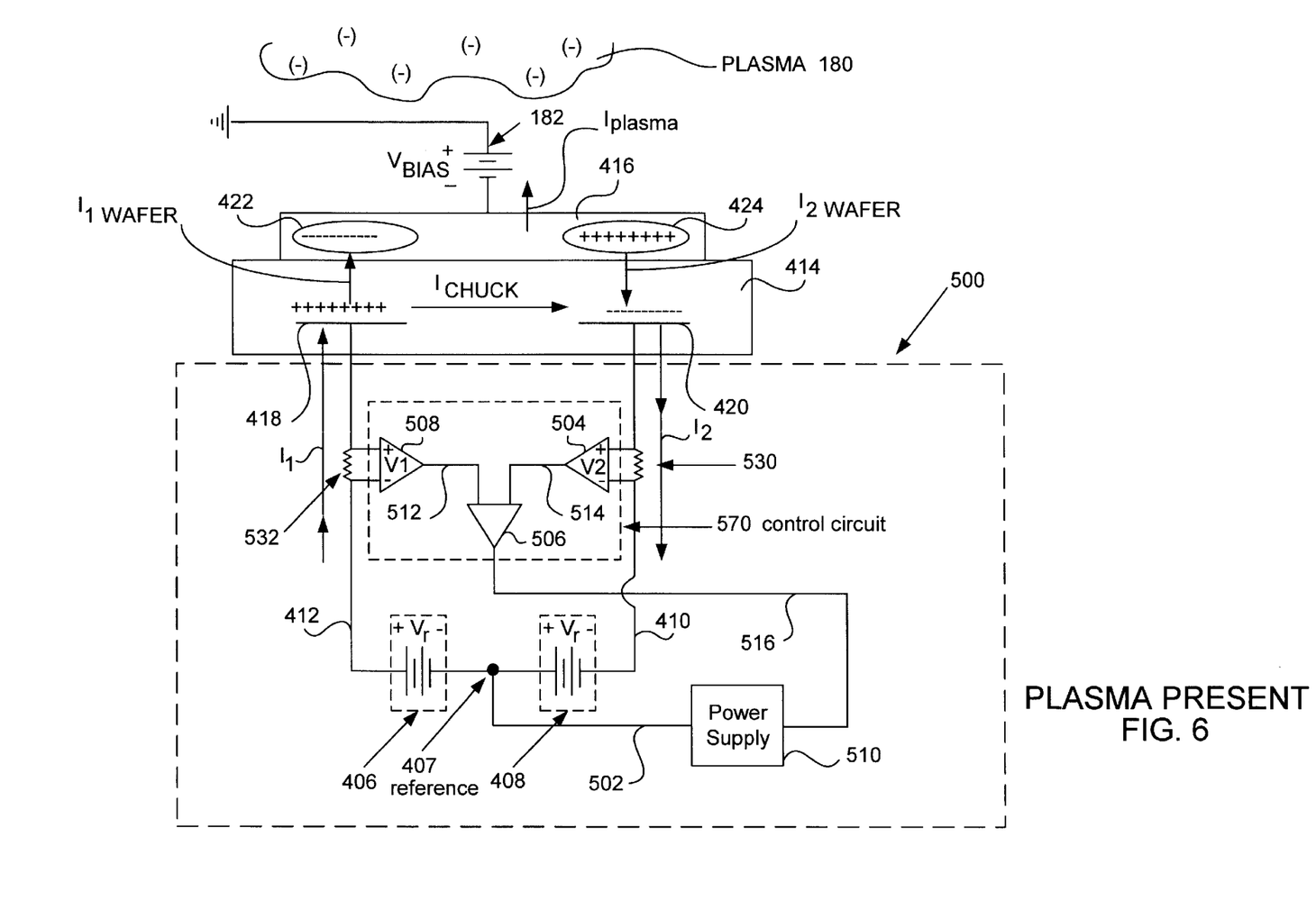
FIG. 6 illustrates the leakage currents present in substrate disposed upon an electrostatic chuck coupled to a self biasing power supply after the introduction of a plasma in accordance with one embodiment of the present invention.

Subsequent to initial set up wherein wafer 416 is clamped to electrostatic chuck 414 and control circuit 570 is in an equilibrium (i.e., $I_1$ substantially equals $I_2$), a negatively charged plasma 180 is introduced into plasma chamber 110. In another embodiment, a positively charged plasma may be introduced. FIG. 6 is a representation of the various leakage currents induced in wafer 416 and electrostatic chuck 414 in the presence of negatively charged plasma 180. In the described embodiment, plasma 180 may be represented as a source of fixed bias potential 182 (i.e., a battery) with its cathode connected to ground (i.e., the chamber wall 111) and its anode connected to wafer 416. As in known to those in the art, plasma 180 also forms a current path from substrate 416 to ground for a current $I_{PLASMA}$.

As described earlier, plasma induced bias $V_{BIAS}$ will create an imbalance in the electrostatic clamping forces holding wafer 416 to chuck 414. This imbalance in clamping forces is due to plasma induced bias $V_{BIAS}$ increasing the potential difference between buried plate 418 and region 422 of wafer 416 and decreasing the potential difference between buried plate 420 and region 424 of wafer 416.

The leakage currents $I_{1WAFER}$ and $I_{2WAFER}$ will also change according to the change in the potential differences between the buried plates and associated regions of wafer 416. In the described embodiment, negatively charged plasma 180 will cause current flow $I_{1WAFER}$ into wafer 416 to increase due to the increase in potential difference between buried plate 418 and region 422 of wafer 416. Concurrently, current flow $I_{2WAFER}$ out of wafer 416 will decrease due to the decrease in potential difference between buried plate 420 and region 424 of wafer 416. The net difference between $I_{1WAFER}$ and $I_{2WAFER}$ is $I_{PLASMA}$. For this example, $I_{PLASMA}$ flows into plasma 180. In another embodiment, a positively charged plasma would result in symmetrically opposite results. (Note: In the described embodiment, leakage current $I_{CHUCK}$ remains essentially unchanged since the potential difference between buried plates 418 and 420 remains unchanged at about $2V_R$.)

By way of example, as shown in FIG. 6, when plasma 180 is introduced in chamber 110, wafer 416 experiences a plasma induced bias $-V_{BIAS}$ (for a positively charged plasma, the plasma induced bias would be $+V_{BIAS}$). Plasma induced bias $-V_{BIAS}$ will increase the potential difference between buried plate 418 and region 422 of wafer 416 to $+V_R-(-V_{BIAS})$ or $V_R +V_{BIAS}$ (buried plate 418 remains at fixed potential $+V_R$ with respect to reference node 407). The increase in potential difference between region 422 of wafer 416 and buried plate 418 will result in a coincident increase in leakage current $I_{1WAFER}$ flowing into wafer 416. Since $I_1 = I_{1WAFER} + I_{CHUCK}$ (Kirchoff's Law) and $I_{CHUCK}$ is unchanged, the increase in $I_{1WAFER}$ due to plasma induced bias $V_{BIAS}$ will increase the first leg current $I_1$ by a proportional amount.

In a similar manner, plasma induced bias $-V_{BIAS}$ will decrease the potential difference between buried plate 420 and region 424 of wafer 416 to $-V_R-(-V_{BIAS})$ or $-V_R+V_{BIAS}$ since buried plate 420 remains at fixed potential $-V_R$ with respect to reference node 407. This decrease in potential difference will result in a decrease in leakage current $I_{2WAFER}$ flowing out of wafer 416. Since $I_2 = I_{2WAFER} + I_{CHUCK}$ (Kirchoff's Law) and $I_{CHUCK}$ is unchanged, the decrease in $I_{2WAFER}$ due to plasma induced bias $-V_{BIAS}$ will decrease the second leg current $I_2$ by a proportional amount.

As discussed above, since $I_{CHUCK}$ remains essentially unchanged, the difference $\Delta 1$ between $I_1$ and $I_2$ is a measure of the offset potential induced by the presence of plasma 180 in wafer 416. The difference $\Delta I$ defines the input for a feedback loop configured by control circuit 570. The feedback loop configured by control circuit 570 is designed to reduce $\Delta I$ to essentially zero (i.e., $I_1$ and $I_2$ are essentially equal). In this embodiment, control circuit 570 reduces $\Delta I$ by offsetting reference node 407 with respect to buried plates 418 and 410. In this manner, the potential differences between buried plates 418 and 420 and associated regions 422 and 424 of wafer 416 are linked to the observed difference between the leakage currents $I_1$ and $I_2$.

By way of example, from Ohm's Law, $I_1$ will generate voltage drop $V_1$ across resistor 532 and $I_2$ will generate voltage $V_2$ across resistor 530. $V_1$ and $V_2$ define the inputs to isolation amplifiers 508 and 504, respectively, whose outputs 512 and 514 define the inputs to differential amplifier 506. According to the described embodiment, differential amplifier 506 generates an output/control signal 516 proportional to the difference between $V_1$ and $V_2$ (directly related to $I_1$ and $I_2$ by Ohm's Law as above). Output/control signal 516 determines the output bias voltage generated by and applied to reference node 407.

Any change in reference node 407 will directly change the bias of buried plates 418 and 420 since they are referenced to node 407. By way of example, if DC power supply 406 applies a bias of $+V_R$ volts to buried plate 418, and reference node 407 has a positive bias of $+V_{ref}$, then the potential for plate 418 will be $+V_R+V_{ref}$. In a similar manner, if DC power supply 408 applies a bias of $-V_R$ volts to buried plate 420, and reference node 407 has a positive bias of $+V_{ref}$, then the potential for plate 420 will be $-V_R+V_{ref}$.

As can be seen, the change in potential difference between buried plates 418 and 420 and associated regions 422 and 424 of wafer 416 in turn affects the leakage currents $I_{1WAFER}$ and $I_{2WAFER}$ within electrostatic chuck 414. Any change in $I_{1WAFER}$ or $I_{2WAFER}$ affect the first leg leakage current $I_1$ and second leg leakage current $I_2$, thus completing the feedback loop.

The described embodiment of the present invention achieves the goal of compensating for unbalanced voltages to the bipolar electrostatic chucks without requiring the use of unreliable and potentially contaminating probe pins. In accordance with another advantageous aspect of the present invention, it is possible to reduce or eliminate any current flow from the substrate to the plasma resulting in reduced risk of arcing, faster throughput since discharge time has been reduced, and reduced voltage necessary for effective clamping of the substrate to the chuck.

Additional advantages of this embodiment include the ability to compensate for unbalanced voltages to the bipolar electrostatic chucks without requiring the use of unreliable and potentially contaminating probe pins. In accordance with another advantageous aspect of the present embodiment, it is possible to reduce or eliminate any current flow from the substrate to the plasma. The reduction or elimination of any current flow from the substrate to the plasma results in reduced risk of arcing, faster throughput (since discharge time has been reduced), and reduced voltage necessary for effective clamping of the substrate to the substrate.

Yet additional advantages include the fact the power supply is easily retrofitable to other systems and there are no external measurement devices (such as probe pins) which may interfere with the process or cause changes to be made to the physical configuration of the chamber for installation.

While this invention has been described in terms of several preferred embodiments, there are alterations, permutations, and equivalents which fall within the scope of this invention. For example, although the discussion is made herein with reference to a plasma etching reactor, the inventive self biasing bipolar ESC chuck power supply may be employed in other plasma reactors as well, e.g., those employed for deposition. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A control circuit configured to control a reference voltage of a reference node of an electrostatic chuck power supply, said electrostatic chuck power supply being configured to clamp a substrate to a bipolar electrostatic chuck having a first buried conductor and a second buried conductor, said electrostatic chuck power supply having a first output configured for being coupled with said first buried conductor, said first output having thereon a first output voltage referenced to said reference voltage, said first output voltage being equal to said reference voltage plus a constant voltage, said electrostatic chuck power supply also having a second output configured for being coupled with said second buried conductor, said second output having thereon a second output voltage referenced to said reference voltage, said second output voltage being equal to said reference voltage less said constant voltage, the difference between said first output voltage and said second output voltage being equal to two times said constant voltage, comprising:

a first resistor coupled in series between said first output and said first buried conductor;

a first amplifier coupled to said first resistor for sensing a first voltage drop across said first resistor;

a second resistor coupled in series between said second output and said second buried conductor;

a second amplifier coupled to said second resistor for sensing a second voltage drop across said second resistor;

a differential amplifier coupled to the outputs of said first amplifier and said second amplifier, said differential amplifier having an output for outputting a control signal, said control signal being approximately proportional to the difference between said first voltage drop and said second voltage drop and to the difference between a first current in said first resistor and a second current in said second resistor;

a variable voltage power source having an output connected to said reference node and an input connected to the output of said differential amplifier, said variable voltage source, in response to said control signal, producing at its output a value of said reference voltage which reduces said difference between said first current and said second current to essentially zero.

2. The control circuit of claim 1 wherein said first resistor and second resistor are configured to work with said chuck, where said chuck comprises resistive material having resistivity in the range of about $10^6$ Ω-cm. to about $10^{18}$ Ω-cm.

3. A power supply configured for coupling with a bipolar electrostatic chuck having a first buried conductor disposed within said chuck and a second buried conductor disposed within said chuck, said power supply comprising:

a reference node, having thereon a variable reference voltage;

a first output configured for being coupled with said first buried conductor, said first output having thereon a first output voltage referenced to said reference node, said first output voltage being equal to said reference voltage plus a constant voltage;

a second output configured for being coupled to said second buried conductor, said second output having thereon a second output voltage referenced to said reference node, said second output voltage being equal to said reference voltage less said constant voltage, the difference between said first output voltage and said second output voltage being equal to two times said constant voltage;

a control circuit coupled to said first output and said second output to sense a current difference between a first current of said first output and a second current of said second output, said control circuit outputting a control voltage on a control output of said control circuit, said control voltage being substantially proportional to said current difference; and supply circuitry configured to receive said control voltage, said supply circuitry outputting, responsive to said control voltage, said reference voltage to said reference node to drive said current difference to approximately zero.

4. The power supply of claim 3 wherein said control circuit further includes:

a first resistor in series between said first output and said first buried conductor;

a first amplifier coupled to said first resistor for sensing a first voltage drop across said first resistor;

a second resistor in series between said second output and said second buried conductor; and a second amplifier coupled to said second resistor for sensing a second voltage drop across said second resistor.

5. The power supply of claim 4 wherein said control circuit further includes a differential amplifier coupled to outputs of said first amplifier and said second amplifier for producing said control voltage.

6. The power supply of claim 4 wherein said first resistor, said second resistor, said first current, and said second current, are configured to work with said chuck, said chuck comprising a resistive material having resistivity in the range of about $10^6$ Ω-cm to about $10^{18}$ Ω-cm.

7. The power supply of claim 3 wherein said supply circuitry comprises a variable voltage power source.

8. In a plasma processing center, a method for clamping a substrate to a chuck, comprising:

providing a chuck having a first buried conductor and a second buried conductor;

providing a first power supply having a reference node, said first power supply having a first output and a second output, said first power supply further comprising a control circuit coupled to said first output and said second output to sense a current difference between a first current of said first output and a second current of said second output, said control circuit outputting a control voltage on a control output of said control circuit to control a potential level on said reference node, said control voltage being substantially proportional to said current difference;

coupling said first buried conductor to said first output;

coupling said second buried conductor to said second output; and providing a second power supply having a node for receiving said control voltage, said second power supply outputting, responsive to said control voltage, said potential level to said reference node.

9. The method of claim 8 wherein said control circuit includes a first resistor in series between said first output and said first buried conductor, and a second resistor in series between said second output and said second buried conductor, said control circuit further including a first amplifier for sensing a voltage drop across said first resistor and a second amplifier for sensing a voltage drop across said second resistor.

10. The method of claim 9 wherein said first resistor and said second resistor are substantially equal in value.

11. The method of claim 9 wherein said first resistor has a value of about 500 kΩ±%1 and said second resistor has a value of about 500 kΩ±1%.

12. The method of claim 9 wherein said control circuit further includes a differential amplifier coupled to outputs of said first amplifier and said second amplifier for producing said control voltage.

13. The method of claim 6 wherein said chuck is formed of a material having resistivity in the range of about $10^{10}$ Ω-cm to about $10^{11}$ Ω-cm.

14. A control circuit configured to control a reference voltage of a reference node of an electrostatic chuck power supply, said electrostatic chuck power supply being configured to clamp a substrate to a bipolar electrostatic chuck having a first buried conductor and a second buried conductor, said electrostatic chuck power supply having a first output configured for being coupled with said first buried conductor, said first output having thereon a first output voltage referenced to said reference voltage, said electrostatic chuck power supply also having a second output configured for being coupled with said second buried conductor, said second output having thereon a second output voltage referenced to said reference voltage, comprising:

first resistive means coupled in series between said first output and said first buried conductor;

first sensing means coupled to said first resistive means for sensing a first voltage drop across said first resistive means;

a second resistive means in series between said second output and said second buried conductor;

second sensing means coupled to said second resistive means for sensing a second voltage across said second resistive means;

a differential amplifying means coupled to outputs of said first sensing means and said second sensing means for producing a control voltage; and circuit means coupled to the output of said differential amplifying means said circuit means being configured for outputting responsive to said control voltage said reference voltage to said reference node.

15. The control circuit of claim 14 wherein said first resistive means is a first resistor and said second resistive means is a second resistor.

16. The control circuit of claim 14 wherein said first sensing means is a first amplifier and said second sensing means is a second amplifier.

17. The control circuit of claim 14 wherein said circuit means is a variable voltage power source.

* * * * *